United States Patent [19]

Yoshihara et al.

[11] 4,377,756
[45] Mar. 22, 1983

[54] SUBSTRATE BIAS CIRCUIT

[75] Inventors: Tsutomu Yoshihara; Kazuhiro Shimotori; Yasuji Nagayama, all of Itami, Japan

[73] Assignee: Mitsubishi Denki Kabushiki Kaisha, Tokyo, Japan

[21] Appl. No.: 120,830

[22] Filed: Feb. 12, 1980

[30] Foreign Application Priority Data

Feb. 12, 1979 [JP] Japan .................... 54-14765

[51] Int. Cl.³ ............ H01L 29/78; H01L 27/04
[52] U.S. Cl. .................... 307/296 R; 307/200 B; 307/304; 357/48; 357/51; 357/23
[58] Field of Search ......... 307/238, 444, 464, 200 B, 307/296 R, 296 A, 297, 304; 357/23, 48, 50, 51, 52

[56] References Cited

U.S. PATENT DOCUMENTS 3,794,862  2/1974  Jenne .......................... 307/304 O
4,164,751  8/1979  Tasch, Jr. ..................... 357/41 O
4,255,756  3/1981  Shimotori et al. ............. 357/23 X

OTHER PUBLICATIONS

Pashley et al., "A 70-ns 1K MOS RAM", 1976 *IEEE International Solid State Service Conference*, (pp. 138,139,238).

Primary Examiner—Larry N. Anagnos
Assistant Examiner—David R. Hudspeth
Attorney, Agent, or Firm—Oblon, Fisher, Spivak, McClelland & Maier

[57] ABSTRACT

An insulated gate field-effect transistor (MOS-FET) formed as a basic element of an integrated circuit formed together with a substrate bias circuit in a semiconductor substrate having negative potential. In the substrate bias circuit, semiconductor regions (p+-regions) having impurity concentrations higher than that of the semiconductor substrate (p-type) are formed between the semiconductor regions (n+-region) and the semiconductor substrate (p-type) to form n+p+p-diodes.

1 Claim, 10 Drawing Figures

SUBSTRATE BIAS CIRCUIT

BACKGROUND OF THE INVENTION

1. Field of the Invention

The present invention relates to an improved substrate bias circuit having an insulated gate field-effect transistor (hereinafter referring to as MOS·FET) as the basic element such as a dynamic memory integrated circuit.

2. Description of the Prior Arts

In semiconductor integrated circuits having a MOS·FET as the main element, a signal is transmitted by charging and discharging the source region and the drain region of the MOS·FET. The operation of a MOS·FET-IC is faster depending upon the charging and discharging speed. For example, in a Random access memory (RAM), it is necessary to shorten the access time by reducing the charging or discharging speed. One of the main parameters effecting the charging and discharging speed is a junction capacitance based on the pn-junction between the semiconductor substrate and the source region and the drain region of the MOS·FET. The charging and discharging speed is increased to fasten the operation of MOS·FET-IC depending upon the decrease of the junction capacitance. The junction capacitance $C_J$ is given by the equation:

$$C_J = \frac{K}{\sqrt{V_o - V}} \quad (I)$$

wherein the reference K designates a constant decided depending upon a semiconductor substrate and the configuration of the MOS·FET; $V_o$ designates a built-in potential which is usually about 0.6 V; and V designates a potential of the semiconductor substrate of the MOS·FET-IC based on the source region and the drain region of the MOS·FET (hereinafter referred to as potential difference).

When the potential difference V is a large negative value, the junction capacitance $C_J$ can be minimized as shown in the equation (I). In general, a voltage of 0 to +5 V is applied from a power source for the MOS·FET-IC to the source region and the drain region of MOS·FET. When the potential of the semiconductor substrate of the MOS·FET-IC is at ground potential, the potential difference V is in a range of 0 to +5 V. On the other hand, when a voltage of about −3 V is applied from the external power source to the semiconductor substrate of MOS·FET-IC, the potential difference V is in a range of −3 to −8 V. The junction capacitance $C_J$ is smaller than that when ground potential is applied to the semiconductor substrate of the MOS·FET-IC. Therefore, the faster operation of the MOS·FET-IC is attained. In order to avoid the need of an additional external power source, a substrate potential circuit device (substrate bias circuit) for generating a negative voltage is formed on the semiconductor substrate of MOS·FET-IC.

FIG. 1 is a partially enlarged sectional view of the conventional substrate bias circuit which relates to the present invention.

In FIG. 1, the reference numeral (1) designates a p-type substrate having an impurity concentration of $10^{14}/cm^3$ to $10^{15}/cm^3$ and having high specific resistance; (2), (3), (4), (5) and (6) respectively designate the first, second, third, fourth and fifth n+-regions having lower resistance which has an impurity concentration of $10^{19}/cm^3$; (7) designates a first gate insulating thin layer made of silicon oxide, etc. which is formed from the first n+-region (2) to the second n+-region (3) on the main surface of the p-type substrate (1); (8) designates a second gate insulating thin layer made of silicon oxide, etc. which is formed from the third n+-region (4) to the fourth n+-region (5) on the main surface of the p-type substrate (1); (9) designates a third gate insulating thin layer made of silicon oxide, etc, which is formed from the fourth n+-region (5) to the fifth n+-region (6) on the main surface of the p-type substrate (1); (10) designates a first gate conductive layer made of polycrystalline silicon, aluminum or molybdenum which is formed on the first gate insulating layer (7); (11) designates a second gate conductive layer made of polycrystalline silicon, aluminum or molybdenum which is formed on the second gate insulating layer (8); (12) designates a third gate conductive layer made of polycrystalline silicon, aluminum, molybdenum etc., which is formed on the third gate insulating layer (9); (13) designates a n-reverse layer induced by the voltage applied to the first gate conductive layer (10) on the main surface under the first gate insulating layer (7); (14) designates a MOS capacitor comprising the first n+-region (2), the second n+-region (3) and the first gate conductive layer (10); (15) designates the first MOS·FET which comprises the third n+-region as the source; the fourth n+-region (5) as the drain; and the second gate conductive layer (11) as the gate; (16) designates the second MOS·FET which comprises the fourth n+-region as the source; the fifth n+-region as the drain; and the third gate conductor (12) as the gate; (17), (18), (19), (20) and (21) respectively designate the first, second, third, fourth and fifth electrodes which are respectively lead out from the first n+-region (2), the second n+-region (3), the third n+-region (4), the fourth n+-region (5) and the fifth n+-region (6); (22) designates a sixth electrode lead out from the second main surface of the p-type substrate; (23), (24) and (25) respectively designate the first, second and third gate electrodes which are respectively lead out from the first gate conductive layer (10), the second gate conductive layer (11) and the third gate conductive layer (12); (26) designates a first wiring line for connecting the first electrode (17) to the second electrode (18); (27) designates a second wiring line for connecting the second electrode (18) to the second gate electrode (24) and the fourth electrode (20); (28) designates a third wiring line for connecting the third gate electrode (25) to the fifth electrode (21) and the sixth electrode (22). A known oscillation circuit having a known ring oscillation circuit (not shown) is formed on the first main surface of the p-type substrate (1) so as to apply the output signal of the circuit to the first gate electrode (23) of the MOS capacitor.

The operation of the conventional substrate bias circuit will be illustrated.

FIG. 2 is a circuit diagram of an equivalent circuit for illustrating the operation of the conventional substrate bias circuit.

In FIG. 2, the reference (29) designates a first parasitic diode having pn+-junction formed between the first n+-region (2) the second n+-region (3) and the p-type substrate (1); (30) designates a second parasitic diode having pn+-junction formed between the fourth n+-region (5), and the p-type substrate (1); (31) designates a first parasitic capacitance which formed equivalently between the first n+-region (2), the second n+-type region (3); the fourth n+-region (5) and the ground potential element; (32) designates a second parasitic capacitance formed equivalently between the p-type substrate (1) and the ground potential element.

FIG. 3(a) is an output signal of the conventional oscillation circuit. In this embodiment, the amplitude of the output voltage of the oscillation circuit is the same as the power voltage $V_{DD}$. In the other cases, the same consideration can be applied.

When the signal shown in FIG. 3(a) is applied to the first gate electrode (23) of MOS capacaitor (14), the following amplitude $V_P$ of the potential of the first wiring line (26) and the second wiring line (27) are given by the capacitance coupling of the MOS capacitor (14).

$$V_P = \frac{C_{14}}{C_{14} + C_{31}} \times V_{DD} \quad (II)$$

wherein $C_{14}$ designates a capacitance of the MOS capacity (14); $C_{31}$ designates a capacitance of the first parasitic capacitance (31).

Usually $C_{14} >> C_{31}$ and accordingly, the equation (II) approaches to the equation:

$$V_P \approx V_{DD} \quad (III)$$

Usually, the potential of the third electrode (19) as the source electrode of the first MOS-FET (15) is ground potential, and accordingly, the first MOS-FED (15) is switched in the ON state when the potential of the second wiring line (27) reaches about the threshold voltage $V_{T15}$ of the first MOS-FET (15). Thus, the potential of the second wiring line (27) is the value between the threshold voltage $V_{T15}$ and $-[V_P - V_{T15}] \approx -[V_{DD} - V_{T15}]$ as shown in FIG. 3(b).

The case approaching to the normal state will be considered.

When the potential of the second wiring line (27) is about threshold voltage $V_{T15}$, the second MOS-FET (16) and the first and second parasitic diode (29), (30) are in the OFF state whereas when it is $-[V_{DD} - V_{T15}]$, the second MOS-FET (16) and the first and second parasitic diodes (29), (30) are in the ON state whereby the charge of the second parasitic capacitance (32) is discharged from the first gate electrode (23) through the second MOS-FET (16), the first and second parasitic diodes (29), (30) and the MOS capacitor (14).

In this discharge, the substrate potential of the p-type substrate (1) is given as one of the following equations depending upon values of $V_{T16}$, $V_{F29}$ and $V_{F30}$.

$$-[V_{DD} - V_{T15} - V_{T16}] \quad (IV)$$

$$-[V_{DD} - V_{T15} - V_{F29}] \quad (V)$$

$$-[V_{DD} - V_{T15} - V_{F30}] \quad (VI)$$

wherein $V_{T16}$ designates a threshold voltage of the second MOS-FET (16); $V_{F29}$ designates forward voltage drop of the first parasitic diode (29) and $V_{F30}$ designates a forward voltage drop of the second parasitic diode (30).

FIG. 4 shows average discharged current of the second parasitic capacitance (32) in the case of $V_{T16} > V_{F29} + V_{F30}$.

The full line (a) shows the current component discharging from the second parasitic capacitance (32) through the first and second parasitic diodes (29), (30); the broken line (b) shows the current component discharging from the second parasitic capacitance (32) through the second MOS-FET (16). In this case, the charge of the second parasitic capacitance (32) is discharged until the substrate potential of the p-type substrate (1) is decreased to the value of the equation (V) as $-[V_{DD} - V_{T15} - V_{F29}]$. In the normal state, it is $-[V_{DD} - V_{T15} - V_{F29}]$ as shown in FIG. 3(c).

On the other hand, in the case of $V_{T16} < V_{F29} = V_{F30}$, the relation of the discharge current of the second parasitic capacitance (32) through the first and second parasitic diodes (29), (30) shown by the full line (a) in FIG. 4 and the discharge current of the second parasitic capacitance (32) through the second MOS-FET (16) shown by the broken line (b) in FIG. 4 are reversed. The substrate potential of the p-type substrate (1), in the normal state, is $-[V_{DD} - V_{T15} - V_{T16}]$ as the equation (IV).

Electrons are injected into the p-type substrate (1) when the second parasitic capacitance (32) is discharged through the first and second parasitic diodes (29), (30). A part of the electrons remain in the p-type substrate (1) for a while and then, the electrons disappear by bonding to positive holes as the majority carrier in the p-type substrate (1). The other electrons pass through the second MOS-FET (16), third wiring line (28) and the sixth electrode (22) to reach the second main surface of the p-type substrate (1), and the electrons disappear by immediately bonding to positive holes at the contact part of the sixth electrode (22) and the second main surface of the p-type substrate (1). The depletion of positive holes corresponding to the electrons is formed in the p-type substrate (1). Therefore, in the conventional substrate bias circuit, the potential of the p-type substrate (1) can be negative. When the substrate bias circuit and a RAM-IC are formed on the same p-type substrate (1), some of electrons injected by the discharged current passed from the second parasitic capacitance (32) through the first and second parasitic diodes (29), (30), remain in the p-type substrate (1) for a while and move in the p-type substrate (1). If the electrons are captured by the memory cell of the RAM-IC, logical data dynamically memorized in the memory cell disappear to cause the erroneous operation of the RAM-IC. This is a fatal disadvantage.

The memory cell of the RAM-IC will be described.

FIG. 5 is a sectional view of the memory cell of the RAM-IC comprising one MOS-FET and one MOS capacitor. FIG. 6 is an equivalent circuit diagram thereof.

In the drawings, the reference numeral (1) designates a p-type substrate having high specific resistance; (33) and (34) respectively designate n+-drain and n+-source regions which have low specific resistance and are selectively formed in a specific space on the first main surface of the p-type substrate (1); (35) designates a first gate insulating layer formed from the n+-drain region (33) to the n+-source region (34) on the main surface of the p-type substrate (1); (36) designates a first gate electrode formed on the first gate insulating layer (35); (37) designates a MOS-FET comprising the n+-drain region (33), the n+-source region (34) and the first gate electrode (36); (38) designates a second gate insulating layer which is formed in contact with the n+-source region (34) on the first main surface of the p-type substrate (1) at the reverse side to the n+-drain region (33); (39) designate a second gate electrode formed on the second gate insulating layer (38); (40) designates a MOS capacitor formed on the first main surface under the second gate electrode (39) and the second gate insulating layer of the p-type substrate (41) designates a bit line as the first wiring line lead out from the n+-drain region (33); (42) designates a word line as the second wiring line lead out from the first gate electrode (36); (43) designates the third wiring line lead out from the second gate electrode (39) to which the maximum voltage (such as +5 V) used in the RAM-IC is usually applied.

The operation of the memory cell will be described. When data having high potential (corresponding to data "1") are written-in the memory cell, high potential is applied to the bit line (41) and then, high potential is applied to the word line (42) whereby the MOS-FET (37) is turned on to transmit the high potential of the bit line (41) to the n+-source region (34) of the MOS-FET (37)and the MOS capacitor (40) is charged in high potential. In this state, only a small number of electrons remain in the MOS capacitor (40).

When the potential of the word line (42) is lowered to change the MOS-FET (37) in the OFF state, the bit line (41) is electrically insulated from the n+-source region of the MOS-FET (37) and the MOS capacitor (40) is kept at the high potential. This is the state of memorizing data in the memory cell. In this state, when the substrate bias circuit shown in FIG. 1 is operated, electrons are injected into the p-type substrate (1) through the first and second parasitic diodes (29), (30) as described referring to the equivalent circuit diagram of FIG. 2. The injected electrons are minor carriers in the p-type substrate whereby the electrons usually disappear near the injected source by bonding to positive holes. However, some of electrons reach near the MOS capacitor (40) of the memory cell as designated by the reference E in FIG. 5. Thus, the electrons are captured by the MOS capacitor (40) which is charged in high potential to have only small number of electrons. Therefore, the charge voltage of the MOS capacitor (40) is changed from high voltage to low voltage sometimes to the ground potential. The ground potential corresponds to the data "0". The data written as the data "1" are output as the data "0" are output as the data "0". Thus, the erroneous operation of the RAM-IC is caused. This is the fatal disadvantage.

SUMMARY OF THE INVENTION

The present invention is to overcome said disadvantages and it is to provide a substrater bias circuit which can be formed on one semiconductor substrate together with a dynamic IC such as RAM-IC by decreasing the number of electrons injected into the semiconductor substrate through the first and second parasitic diodes and shortening the life time of the injected electrons.

DETAILED DESCRIPTION OF THE PREFERRED EMBODIMENTS

Figure 7:
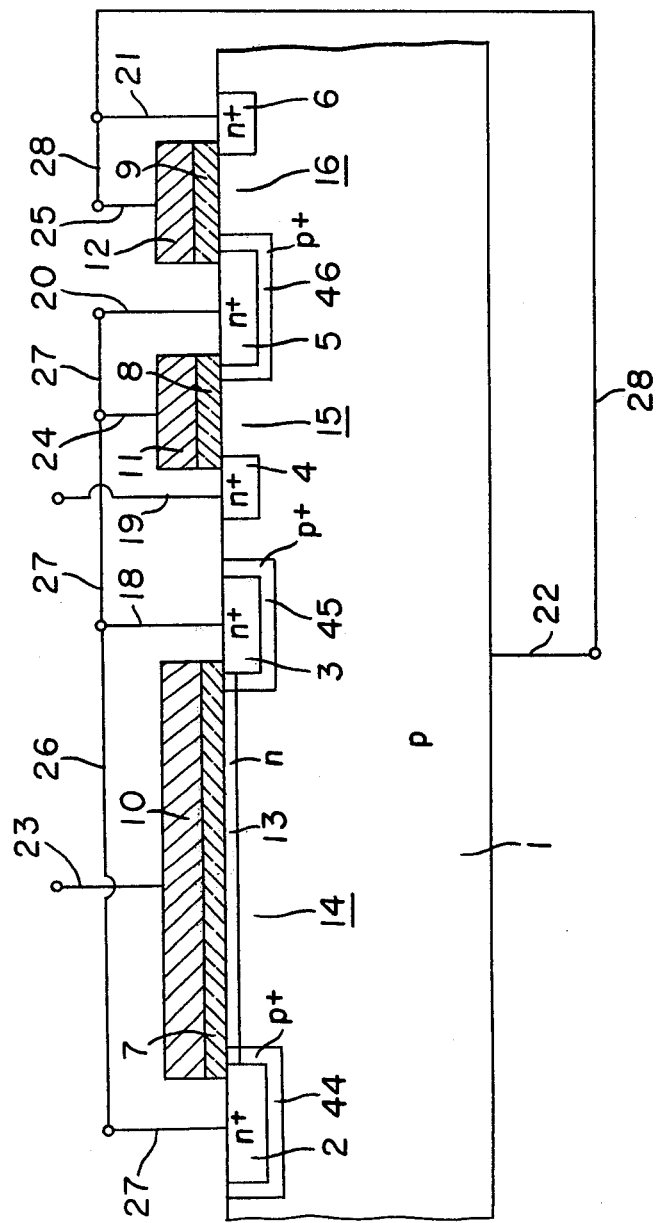
FIG. 7 is a partially enlarged sectional view of one embodiment of the substrate bias circuit of the present invention.

FIG. 7 is a partially enlarged sectional view of one embodiment of the substrate bias circuit of the present invention.

In FIG. 7, the reference numeral (44) designates a first p+-region which has higher impurity concentration comparing to that of the p-type substrate (1) and is formed at the contact surface of the first n+-region (2) of the MOS capacitor (14) on the p-type substrate (1); (45) designates a second p+-region which has higher impurity concentration comparing to that of the p-type substrate (1) and is formed at the contact surface of the second n+-region (3) of the MOS capacitor (14) on the p-type substrate (1); (46) designates a third p+-region which has higher impurity concentration comparing to the p-type substrate (1) and is formed at the contact surface of the fourth n+-region on the p-type substrate.

The impurity concentrations in the first p+-region (44); the second p+-region (45) and the third p+-region (46) are respectively about $10^{19}/cm^3$.

Figure 1:
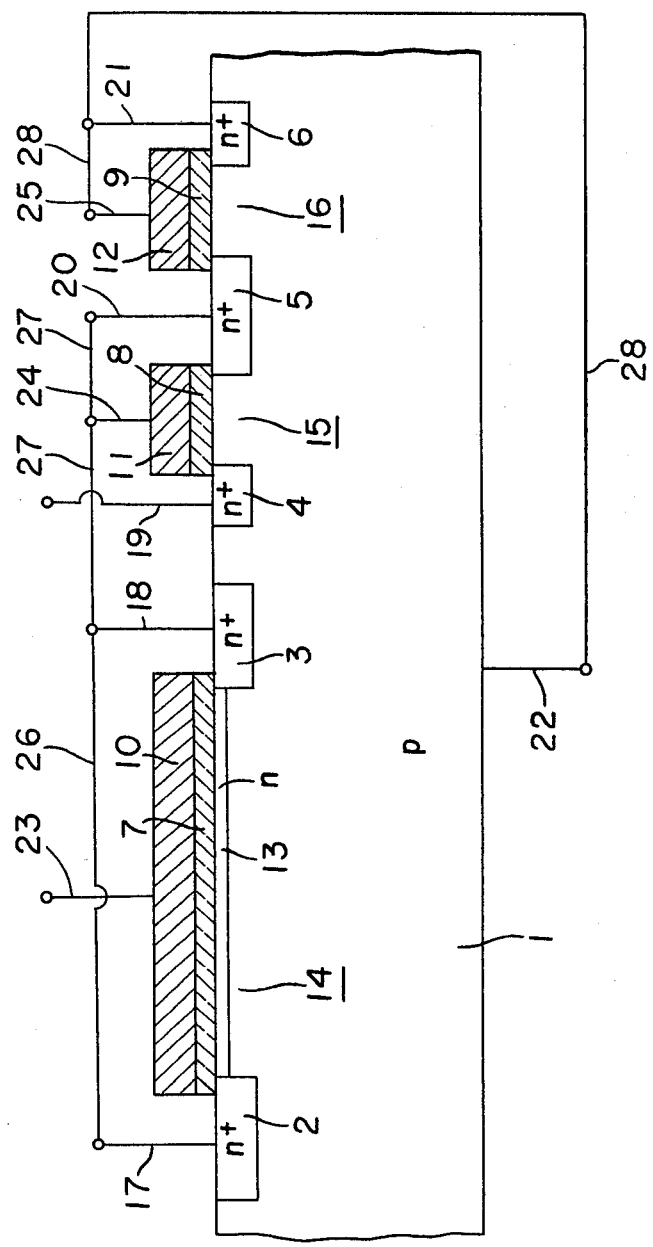
FIG. 1 is a partially enlarged sectional view of the conventional substrate bias circuit.

The structure of this embodiment of the substrate bias circuit of the present invention is the same as that of the conventional substrate bias circuit shown in FIG. 1, except forming the first p+-region (44), the second p+-region (45) and the third p+-region (46).

Figure 8:
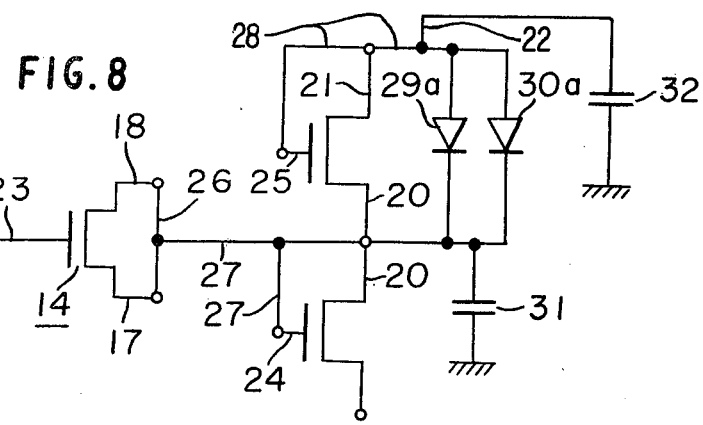
FIG. 8 is a circuit diagram as the equivalent circuit of FIG. 7.

FIG. 8 is a circuit diagram as the equivalent circuit of this embodiment of the substrate bias circuit of the present invention.

In FIG. 8, the reference numeral (29a) designates a first parasitic diode having pp+n+-junctions which is formed between the first n+-region (2) and the second n+-region (3) and the p-type substrate (1) through the first p+-region (44) and the second p+-region (45); and (30a) designates a second parasitic diode having pp+n+-junctions which is formed between the fourth n+-region (5) and the p-type substrate (1) through the third p+-region (46).

Figure 2:
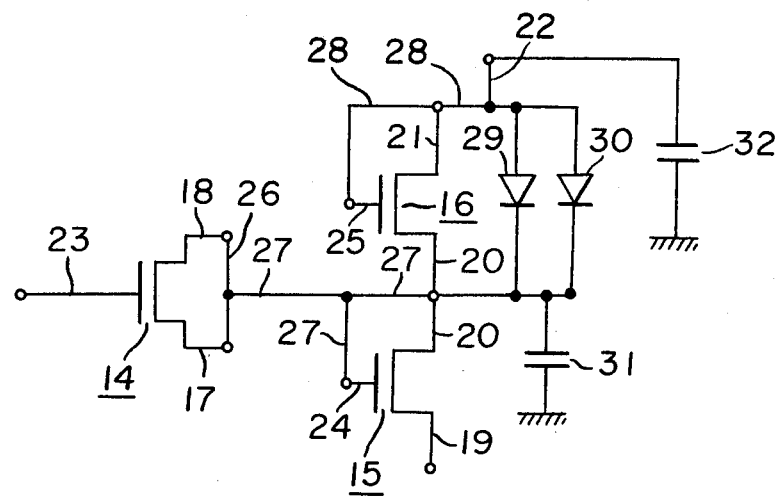
FIG. 2 is a circuit diagram as the equivalent circuit of FIG. 1.
Figure 3:
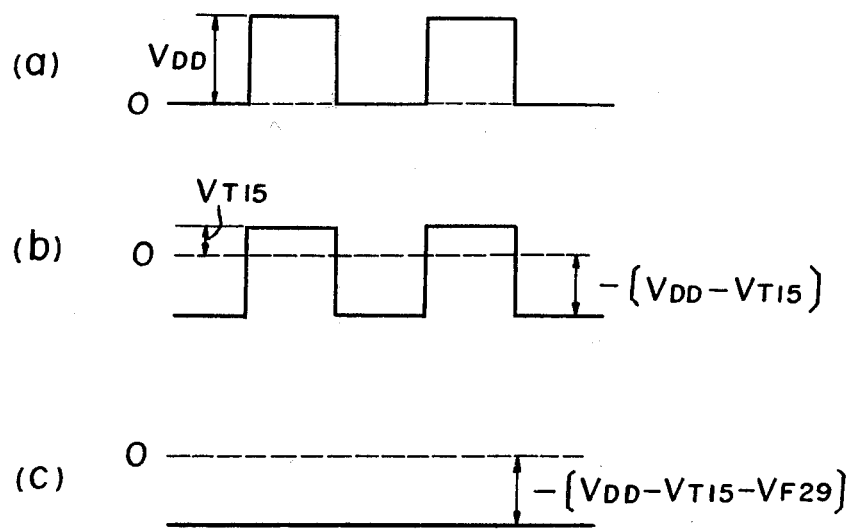
FIG. 3 is a diagram for illustrating timings of the operation.
Figure 4:
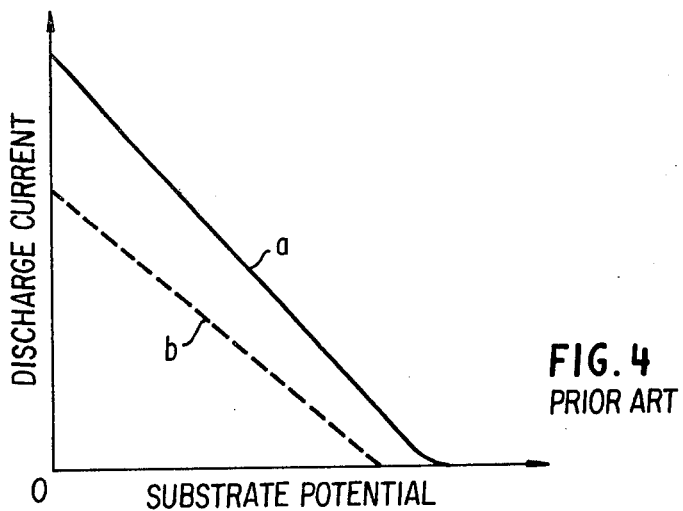
FIG. 4 is a graph showing a relation of the discharge current from the substrate of the conventional substrate bias circuit and the substrate potential.
Figure 5:
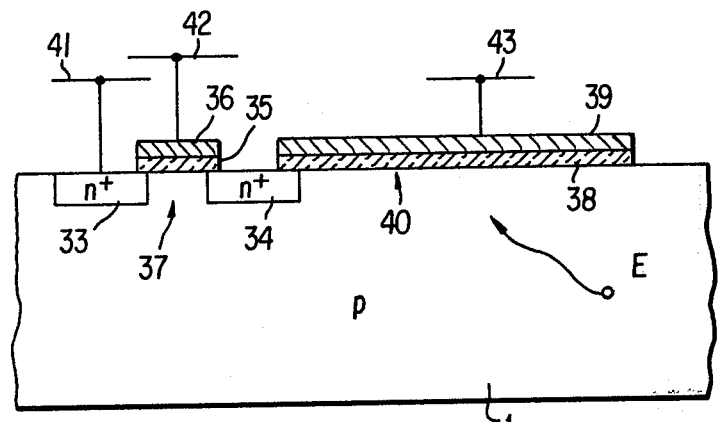
FIG. 5 is a sectional view of the memory cell of the RAM-IC.
Figure 6:
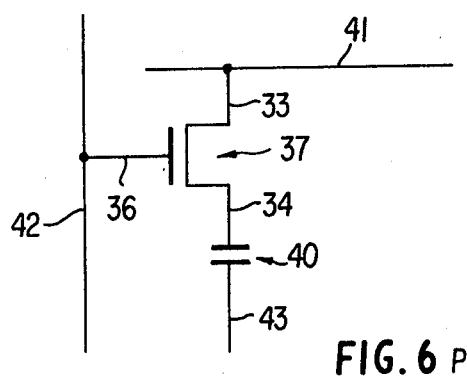
FIG. 6 is a circuit diagram as the equivalent circuit of FIG. 5.

The equivalent circuit of this embodiment is the same as the equivalent circuit of the conventional embodiment shown in FIG. 2 except forming the first and second parasitic diodes (29a), (30a) as described.

The operation of the embodiment of the substrate bias circuit is substantially the same as that of the conventional embodiment. Therefore, the description of the operation is not repeated.

In this embodiment of the substrate bias circuit of the present invention, the junctions of the first and second diodes (29a), (30a) are respectively pp+n+-junctions. The forward voltage drops $V_{F29a}$, $V_{F30a}$ are higher than the forward voltage drops $V_{F29}$, $V_{F30}$ of the first and second parasitic diodes (29), (30) having pn+-junction of the conventional embodiment. Therefore, the number of electrons injected into the p-type substrate (1) through the first and second parasitic diodes (29a), (30a) is smaller than that of the conventional embodiment.

Usually, the forward voltage drop of a diode is given by a sum of Fermi potentials of p-region and an n-region of the diode.

Both of the n-regions for the junction of the first and second parasitic diodes (29a), (30a) of the embodiment of the present invention and the n-regions for the first and second parasitic diodes (29), (30) of the conventional embodiment are respectively the first, second and fourth n+-regions (2), (3), (5). The impurity concentrations of these n+-regions (2), (3) (5) are high enough and constant to be about $10^{19}/cm^3$. Therefore, the difference between the forward voltage drops $V_{F29a}$, $V_{F30a}$ of the first and second parasitic diodes (29a), (30a) of the embodiment of the present invention and the forward voltage drops $V_{F29}$, $V_{F30}$ of the first and second parasitic diodes of the conventional embodiment, corresponds to the difference between the Fermi potential of the first, second and third p+-regions (44), (45), (46), for the junctions of the first and second parasitic diodes (29a), (30a) of the embodiment of this invention and the Fermi potential of the p-type substrate (1) for the junction of the first and second parasitic diodes (29) (30) of the conventional embodiment.

Figure 9:
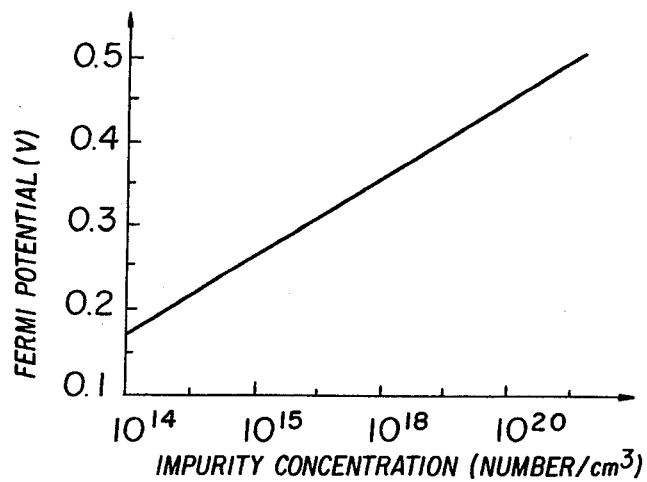
FIG. 9 is a graph showing a relation of concentrations of an impurity and Fermi-potentials.

FIG. 9 is a graph shwing the relation of the impurity concentrations and Fermi potentials. In FIG. 9, Fermi potential is plotted on the ordinate and the impurity concentration is plotted on the abscissa.

As it is understood by FIG. 9, the Fermi potentials of the first, second and third p+-regions (44), (45), (46) are about 0.41 V because the impurity concentrations in said p+-regions (44), (45), (46) are about $10^{19}/cm^3$. On the other hand, the Fermi potentials of the p-type substrate are about 0.17 V to 0.22 V because the impurity concentrations of the p-type substrate (1) are about $10^{14}/cm^3$ to $10^{15}/cm^3$. The forward voltage drops $V_{F29a}$, $V_{F30a}$ of the first and second parasitic diodes (29a), (30a) in the embodiment of the present invention are higher than the forward voltage drops $V_{F29}$, $V_{F30}$ of the first and second parasitic diodes (29), (30) of the conventional embodiment by about 0.3 V. Therefore, as described referring to the equivalent circuit diagram of FIG. 2, the number of electrons injected into the p-type substrate (1) through the first and second parasitic diodes (29a), (30a) of the second parasitic capacitance (32) of the embodiment of the present invention is lower than the number of electrons injected into the p-type substrate (1) through the first and second parasitic diodes (29), (30) of the second parasitic capacitance (32) of the conventional embodiment.

The life time of the electrons injected from the n-region into the adjacent p-region until disappearing thereof by bonding to positive holes in the p-region will be described.

Figure 10:
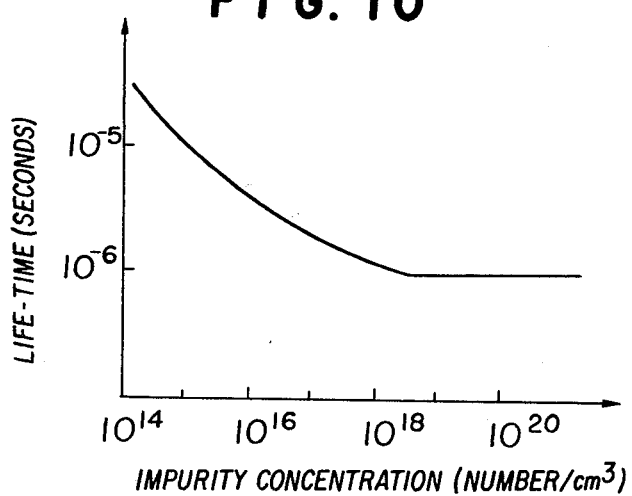
FIG. 10 is a graph showing a relation of concentrations of an impurity and life-times.

FIG. 10 is a graph showing a relation of impurity concentrations and life-times. In FIG. 10, the life-time is plotted on the ordinate and the impurity concentration is plotted on the abscissa.

As it is understood from FIG. 10, the life-times of electrons injected from the first, second and fourth n+-regions (2), (3), (5) into the first, second and third p+-regions (44), (45), (46) having concentrations of about $10^{./}cm^3$ in the embodiment of the present invention are shorter than the life-times of electrons injected from the first, second and fourth n+-regions (2), (3) (5) into the p-type substrate (1) having the impurity concentrations of about $10^{14}/cm^3$ to $10^{15}/cm^3$ in the conventional embodiment by a factor of about ten.

These results are found regardless of the difference of the threshold voltage $V_{T16}$ of the second MOS-FET (16) and the forward voltage drops $V_{F29a}$, $V_{F30a}$ of the first and second parasitic diodes (29a), (30a). The operation of the substrate bias circuit of the present invention is not prevented.

In the substrate bias circuit of the embodiment of the present invention, the first, second and fourth n+-regions (2), (3), (5) which are respectively connected to the first and second wiring lines (26), (27) for oscillating the negative potential, are surrounded by the first, second and third p+-regions having high impurity concentrations, whereby the number of electrons injected into the p-type substrate (1) at the discharge of the second parasitic capacitance (32) can be lower and the lifetimes of the injected electrons can be shortened in comparison with those of the conventional embodiment.

When both of the RAM-IC and the substrate bias circuit of the embodiment are formed in one p-type substrate (1), a probability that electrons injected into the p-type substrate (1) are captured by the memory cell of the RAM-IC after moving in the p-type substrate (1) can be minimized and an erroneous operation of the RAM-IC can be substantially prevented.

When both of the other dynamic IC (beside RAM-IC) and the substrate bias circuit of the embodiment are formed in one p-type substrate (1), an erroneous operation of such dynamic IC can be substantially prevented.

In the embodiment, only the first, second and fourth n+-regions (2), (3), (5) are respectively surrounded by the first, second and third p+-regions (44), (45), (46). Thus, when the first, second, third, fourth and fifth n+-regions (2), (3), (4), (5), (6) are respectively surrounded by the p+-regions having high impurity concentration, the effect of the present invention will be further improved.

In the above-described embodiment, the p-type substrate is used. When an n-type substrate is used, p-type is changed to n-type and n-type is changed to p-type and the applied voltage is reversed.

As described above, the substrate bias circuit of the present invention comprises the semiconductor substrate of a first conductivity, the first, second, third, fourth and fifth semiconductor regions of a second conductivity which are formed with each space on the first main surface of the semiconductor substrate; the first gate conductive layer which is formed from the first semiconductor region to the second semiconductor region through the first gate insulating layer on the main surface of the semiconductor substrate; the second gate conductive layer which is formed from the third semiconductor region to the fourth semiconductor region through the second gate insulating layer on the main surface of the semiconductor substrate; the third gate conductive layer which is formed from the fourth semiconductor region to the fifth semiconductor region through the third gate insulating layer on the main surface of the semiconductor substrate; the first wiring line connecting the first semiconductor region to the second semiconductor region; the second wiring line connecting the first wiring line to the second gate conductive layer and the fourth semiconductor region; and the third wiring line connecting the third gate conductive layer to the fifth semiconductor region and the electrode lead out from the second main surface of the semiconductor substrate. A field-effect capacitor is formed by using the first and second semiconductor regions connected by the first wiring line as one electrode and using the first gate conductive layer as the other electrode. A first field-effect transistor is formed by using the third semiconductor region as the source; using the fourth semiconductor region as the drain and using the second gate conductive layer as the gate. A second field-effect transistor is formed by using the fourth semiconductor region as the source; using the fifth semiconductor region as the drain and using the third gate conductive layer as gate. The potential of the third semiconductor region is the ground potential. An AC signal is applied to the first gate conductive layer to provide negative potential to the semiconductor substrate. In said structure, the first, second and third semiconductor regions of the first conductivity which have impurity concentrations higher than that of the semiconductor substrate are formed around the contact surfaces of the first, second and fourth semiconductor regions to the semiconductor substrate whereby the quantity of minority carriers injected into the semiconductor substrate through the first, second and fourth semiconductor regions can be decreased and the lifetimes of the carriers can be shortened. Therefore, when the substrate bias circuit of the present invention is formed with a dynamic IC on one semiconductor substrate, an erroneous operation of the dynamic IC caused by the injection of the carriers can be prevented.

We claim:

1. In a substrate bias circuit comprising a semiconductor substrate of a first conductivity; first, second, third, fourth and fifth semiconductor regions of a second conductivity which are formed with each space on a first main surface of said semiconductor substrate; a first gate conductive layer which is formed from said first semiconductor region to said second semiconductor region through a first gate insulating layer on the main surface of said semiconductor substrate; a second gate conductive layer which is formed from said third semiconductor region to said fourth semiconductor region through a second gate insulating layer on the main surface of said semiconductor substrate; a third gate conductive layer which is formed from said fourth semiconductor region to said fifth semiconductor region through a third gate insulating layer on the main surface of said semicoductor substrate; a first wiring line connecting said first semiconductor region to said second semiconductor region; a second wiring line connecting said first wiring line to said second gate conductive layer and said fourth semiconductor region; a third wiring line connecting said third gate conductive layer to said fifth semiconductor region and an electrode lead out from the second main surface of said semiconductor substrate; a field-effect capacitor formed by using said first and second semiconductor regions connected by said first wiring line as one electrode and using said first gate conductive layer as the other electrode, a first field-effect transistor formed by using said third semiconductor region as the source; using said fourth semiconductor region as the drain and using said second gate conductive layer as the gate, a second field-effect transistor formed by using said fourth semiconductor region as the source; using said fifth semiconductor region as the drain and using said third gate conductive layer as the gate; wherein a potential of said third semiconductor region is the earth potential and a potential of said semiconductor substrate is a negative potential under applying an AC signal to said first gate conductive layer; an improvement characterized in that first, second and third semiconductor regions of the first conductivity which have impurity concentrations higher than that of said semiconductor substrate are formed around the contact surfaces of said first, second and fourth semiconductor regions to said semiconductor substrate.

* * * * *